United States Patent [19]

Sato

[11] Patent Number: 4,983,832
[45] Date of Patent: Jan. 8, 1991

[54] SCANNING ELECTRON MICROSCOPE

[75] Inventor: Mitsugu Sato, Katsuta, Japan

[73] Assignee: Hitachi, Ltd., Tokyo, Japan

[21] Appl. No.: 381,189

[22] Filed: Jul. 18, 1989

[30] Foreign Application Priority Data

Jul. 25, 1988 [JP] Japan ................. 63-183623

[51] Int. Cl.⁵ .............................................. H01J 29/70
[52] U.S. Cl. .................................. 250/310; 250/309;
250/396 R; 250/396 ML
[58] Field of Search ........... 250/310, 311, 309, 396 R,
250/396 ML, 441.1

[56] References Cited

U.S. PATENT DOCUMENTS

| | | | |
|---|---|---|---|
| 3,801,784 | 4/1974 | Wittry | 250/306 |
| 3,993,905 | 11/1976 | Mollenstedt | 250/310 |
| 4,068,123 | 1/1978 | Kakubo | 250/310 |
| 4,431,915 | 2/1984 | Nakagawa et al. | 250/310 |
| 4,479,060 | 10/1984 | Tamura at al. | 250/310 |
| 4,623,783 | 11/1986 | Kondo | 250/310 |
| 4,626,689 | 12/1986 | Tomita et al. | 250/310 |
| 4,677,296 | 6/1987 | Lischke et al. | 250/310 |
| 4,713,543 | 12/1987 | Feuerbaum et al. | 250/310 |
| 4,713,687 | 12/1987 | Shimizu et al. | 250/310 |
| 4,714,833 | 12/1987 | Rose et al. | 250/310 |

FOREIGN PATENT DOCUMENTS

| | | |
|---|---|---|
| 1300624 | 12/1972 | Japan . |
| 1411793 | 10/1975 | Japan . |
| 2162682 | 2/1986 | Japan . |
| 1424224 | 2/1976 | Netherlands . |
| 1469777 | 4/1977 | Netherlands . |
| 1284061 | 2/1972 | United Kingdom . |
| 1315945 | 5/1973 | United Kingdom . |

OTHER PUBLICATIONS

JP-58-147948 A, Electroptic System for Scanning Electron Microscope or the like 09-02-1983, EIJI Watanabe.

Primary Examiner—Jack I. Berman
Assistant Examiner—Kiet I. Nguyen
Attorney, Agent, or Firm—Antonelli, Terry, Stout & Kraus

[57] ABSTRACT

In a scanning electron microscope scanning a specimen by an electron beam, the electron beam is two-dimensionally deflected so that a deflection fulcrum for the electron beam is located on the principal plane of an objective lens. Further, in order that the electron beam is incident on the specimen at a predetermined angle of incidence, the electron beam is deflected in a relation in which the object point of the objective lens provides another deflection fulcrum. The angle of incidence of the electron beam incident on the specimen is changed over between $+\theta$ and $-\theta$, thereby providing a pair of stereoscopic scanned images of the specimen.

14 Claims, 2 Drawing Sheets

SCANNING ELECTRON MICROSCOPE

BACKGROUND OF THE INVENTION

1. FIELD OF THE INVENTION

This invention relates generally to scanning electron microscopes, and more particularly to a scanning electron microscope suitable for stereoscopic observation of a specimen.

2. DESCRIPTION OF THE RELATED ART

In a scanning electron microscope, an electron beam emitted from an electron gun is focused on a specimen by an objective lens. The specimen is two-dimensionally scanned by the focused electron beam, and, as a result of scanning, an information signal characterizing the specimen is generated from the specimen. Any of secondary electrons, reflected electrons, absorbed electrons, X-rays and cathode luminescence may be used as sources for providing such an information signal. The information signal is detected and applied to a cathode-ray tube for the purpose of brightness modulation. On the other hand, two-dimensional scanning of the display screen of the cathode-ray tube by cathode rays (an electron beam) is effected in synchronism with the two-dimensional scanning of the specimen by the focused electron beam. Therefore, an image of the scanned region of the specimen based on the information signal generated from the specimen, that is, a scanned specimen image is displayed on the screen of the cathode-ray tube.

Also, according to the scanning electron microscope, stereoscopic observation of scanned specimen images is frequently desired. It is necessary to direct the electron beam toward and onto the specimen at a selected angle of incidence. Two methods are known for directing the electron beam toward and onto the specimen in an angular relation. According to one of these methods, the direction of the electron beam is fixed, while the specimen is mechanically inclined. On the other hand, according to the other method, the specimen is fixed, while the electron beam is deflected. However, in the case of the former method, a large-sized device for inclining the specimen is required when the specimen has a large size, and the distance between the objective lens and the specimen, that is, the working distance becomes inevitably large when the specimen is to be inclined through a large angle. Thus, when the size of the specimen is large, the latter method is preferably employed.

According to JP-A-58-147948 which discloses a scanning electron microscope and is already known, a parallel electron beam is directed toward a position on the principal plane of the microscope's objective lens, which position is outside the axis of the objective lens. (This position will be referred to hereinafter as an off-axis position). As a result, the parallel electron beam is focused on a desired spot of a specimen by the objective lens and incident on the desired spot at a selected angle of incidence. In this case, in order to attain two-dimensional scanning of the specimen by the electron beam focused to obtain a scanned specimen image, it is proposed that the deflection fulcrum for the electron beam used for scanning the specimen is to be located (1) at a position where the deflection fulcrum coincides with the deflection fulcrum of the parallel electron beam deflected to be directed toward the off-axis position on the principle plane of the objective lens; or (2) at a position on the principal plane of the objective lens; or (3) at a position between the objective lens and the specimen.

However, in the case of the proposal (1), the parallel electron beam moves on the principal plane of the objective lens during scanning the specimen, resulting in an increased distortion of the scanned specimen image. In order to minimize this image distortion, it is necessary to increase the aperture of the objective lens. In the case of the proposal (2), the beam deflecting means for specimen scanning purpose must be disposed inside the objective lens. Therefore, it is necessary to correspondingly increase the aperture of the objective lens. In the case of the proposal (3), the beam deflecting means for specimen scanning purposes must be disposed between the specimen and the objective lens. Therefore, it is necessary to correspondingly increase the working distance. When the angle of incidence of the electron beam on the specimen is supposed to be fixed, and the working distance is increased in such a case, the aperture of the objective lens must be correspondingly increased.

The fact that the objective lens has a large aperture means that the objective lens has a long focal distance. Thus, the coefficient of chromatic aberration Cc increases, and the resolution is greatly lowered. This is because the resolution is degraded in proportion to the half power $(Cc^{\frac{1}{2}})$ of the coefficient of chromatic aberration Cc. The sam also applies when the working distance increases. This is because the focal distance of the objective lens increases.

In the scanning electron microscope, it is desirable to change the strength of electron beam current irradiating the specimen or to change the beam reduction rate of the electron-beam optical system, and, of this purpose, it is customary to focus the electrons beam at least once at a position between the electron gun and the objective lens. Therefore, in order to cause incidence of the parallel electron beam on the objective lens, it becomes necessary to additionally provide a lens which converts the focused electron beam into the parallel electron beam.

SUMMARY OF THE INVENTION

It is an object of the present invention to provide a scanning electron microscope suitable for obtaining high-resolution stereoscopic scanned images of a specimen.

Another object of the present invention is to provide a scanning electron microscope suitable for displaying such high-resolution stereoscopic scanned specimen images by preventing an undesirable increase in the aperture of the objective lens, while, at the same time, preventing an undesirable increase in the working distance.

Still another object of the present invention is to provide a scanning electron microscope suitable for observation of such high-resolution stereoscopic scanned specimen images without the need for converting the electron beam incident on the objective lens into a parallel beam.

In accordance with one aspect of the present invention which attains the above objects, there is provided a scanning electron microscope comprising means for emitting an electron beam; mean for focusing the electron beam on a specimen, the focusing means including an objective lens; first deflecting means for deflecting the electron beam so as to scan the specimen by the electron beam, the first deflecting means deflecting the electron beam so that a deflection fulcrum for the electron beam is substantially located on the principal plane of the objective lens; second deflecting means for deflecting the electron beam so as to cause incidence of the electron beam on the specimen at a predetermined angle of incidence, the second deflecting means deflecting the electron beam so that the deflection fulcrum of the electron beam coincides substantially with the object point of the objective lens; and means for detecting an information signal which is generated from the specimen as a result of scanning the specimen by the electron beam and which characterized the specimen.

Other objects, features and advantages of the present invention will become apparent from the following detailed description when read in conjunction with the accompanying drawings.

DESCRIPTION OF THE PREFERRED EMBODIMENTS

A preferred embodiment of the scanning electron microscope according to the present invention will now be described in detail with reference to the drawings.

Figure 1:
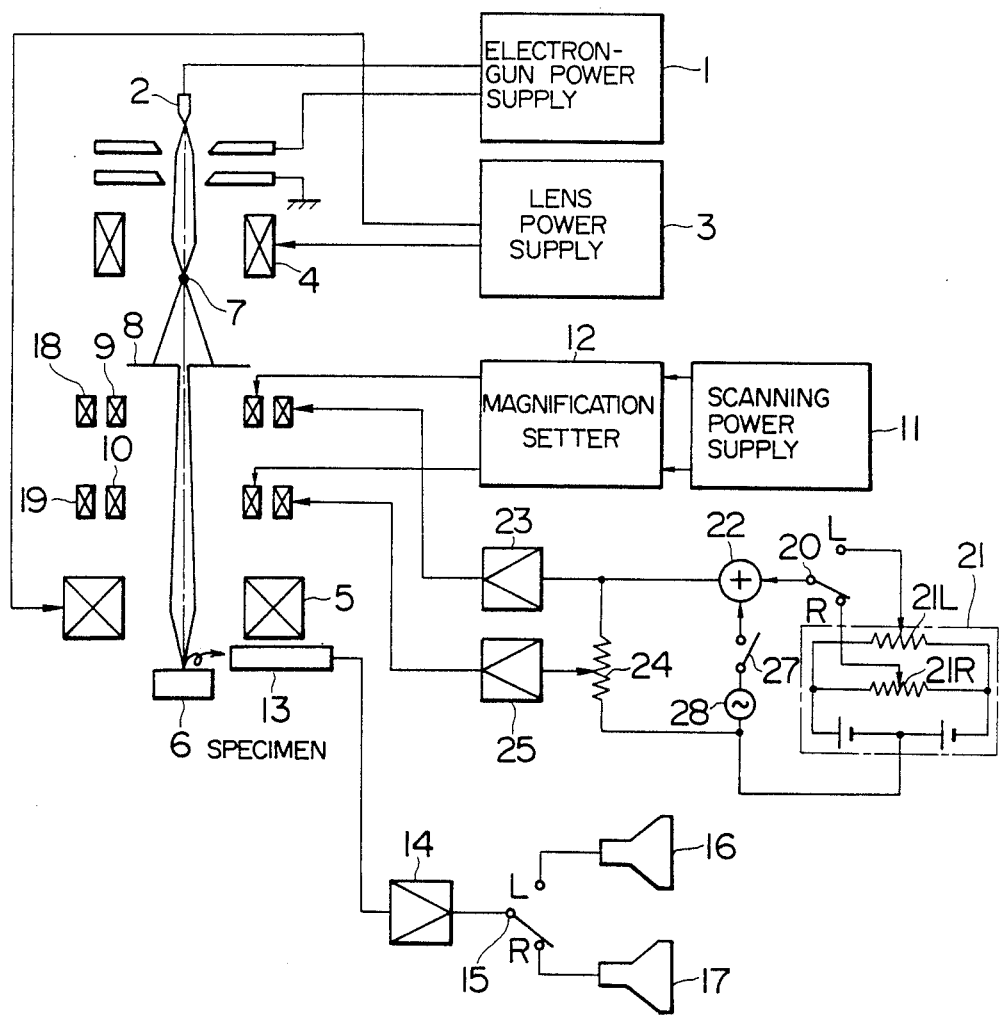
FIG. 1 is a block diagram showing schematically the structure of a preferred embodiment of the scanning electron microscope according to the present invention.

Referring to FIG. 1, an electron-gun power supply 1 energizes an electron gun 2, and an electron beam is emitted from the electron gun 2. The electron beam emitted from the electron gun 2 is focused on a specimen 6 by the combination of a focusing lens system 4, energized by a lens power supply 3, and an objective lens 5. That is, a crossover image of the electron source of the electron gun 2 is formed at a position 7 by the focusing lens system 4, and that image is focused on the specimen 6 by the objective lens 5. Therefore, the position 7 means the object point of the objective lens 5. An objective diaphragm 8 is disposed downstream of the position 7. Therefore, the electron beam is limited by this object diaphragm 8. The focusing lens system 4 may include a single lens only or two or more lenses.

Figure 2:
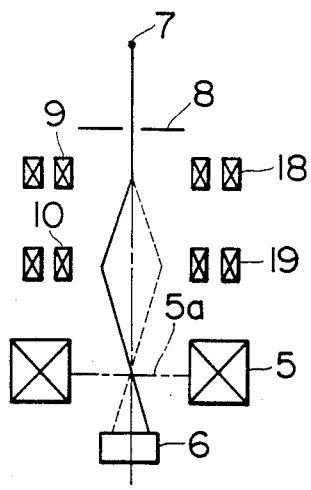
FIG. 2 shows an electron-beam optical system established when the deflecting system for the specimen scanning purpose shown in FIG. 1 is activated.

First and second electromagnetic deflecting means 9 and 10 for specimen scanning purposes are disposed in spaced apart relation between the objective diaphragm 8 and the specimen 6. A scanning power supply 11 applies a two-dimensional scanning signal through a magnification setter 12 to these deflecting means 9 and 10, so that the electron beam is two-dimensionally deflected in such a relation that a beam deflection fulcrum is located on the principal plane 5a of the objective lens 5 as shown in FIG. 2. Thus, the specimen 6 is two-dimensionally scanned by the focused electron beam between a position shown by a solid line in FIG. 2 and another position shown by a broken line. As a result of the scanning, information signals characterizing the specimen 6 are generated from the specimen 6. These information signals are generally given by secondary electrons, reflected electrons, absorbed electrons, X-rays and cathode luminescence. Although any desired one of these information signals may be utilized, the secondary electron signal is utilized in the embodiment shown in FIG. 1. That is, a detector 13 detects this secondary electron signal, and the output signal of the detector 13 is applied through a video amplifier 14 and a switch 15 to a cathode-ray tube 16 or 17 to be used for brightness modulation. Although not shown in FIG. 1, the two-dimensional scanning signal from the scanning power supply 11 is also applied to the cathode-ray tubes 16 and 17. Therefore, a scanned image of the specimen 6 is displayed on the cathode-ray tube 16 or 17.

First and second electromagnetic deflecting means 18 and 19 for optical-axis deflecting purposes are further disposed in spaced apart relation between the objective diaphragm 8 and the specimen 6. The positions of these electromagnetic deflecting means 18 and 19 in the direction of the electron beam are substantially the same as those of the first and second electromagnetic deflecting means 9 and 10 respectively.

A switch 20 has two positions R and L, and a d.c. power supply circuit 21 includes variable resistors 21R and 21L. When the switch 20 is changed over to the position R, a d.c. signal derived from the variable resistor 21R in the d.c. power supply circuit 21 is applied, on one hand, to the first electromagnetic deflecting means 18 through an adder 22 and an amplifier 23, and, on the other hand, to the second electromagnetic deflecting means 19 through the adder 22, a variable resistor 24 and an amplifier 25. On the other hand, when the switch 20 is changed over to the position L, a d.c. signal derived from the variable resistor 21L in the d.c. power supply circuit 21 is applied to the first and second electromagnetic deflecting means 18 and 19 by way of similar routes.

Figure 3:
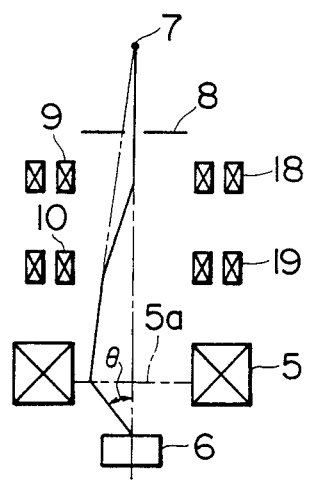
FIG. 3 shows another electron-beam optical system established when the deflecting system for the optical-axis deflection purpose shown in FIG. 1 is activated.

When the switch 20 is in its position R, the electron beam is deflected by the first and second electromagnetic deflecting means 18 and 19 in a manner as shown in FIG. 3. That is, the position 7 is now the deflection fulcrum for the electron beam as shown in FIG. 3, and the electron beam is incident on the specimen 6 at an angle of incidence $+\theta$. On the other hand, when the switch 20 is in its position L, the electron beam is also deflected at the position 7, and, although not shown in FIG. 3, incident on the specimen 6 at an angle of incidence $-\theta$. Thus, when the switch 20 is changed over between its positions R and L, the incident direction of the electron beam in the latter case is opposite to that in the former case while the absolute value of the angle of incidence $\theta$ of the electron beam is the same.

Figure 4:
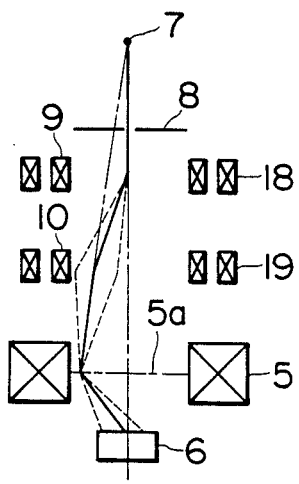
FIG. 4 shows a composite electron-beam optical system established when both the specimen scanning purpose deflecting system and the optical-axis deflection purpose deflecting system are activated.

The behavior of the electron beam will be as shown in FIG. 4, when the deflecting system for specimen scanning purposes is activated to deflect the electron beam in a manner as shown in FIG. 2, and, at the same time, the deflecting system for optical-axis deflection purpose is activated to deflect the electron beam in a manner as shown in FIG. 3. In FIG. 4, the solid lines represent the path of the electron beam when the deflecting system for optical-axis deflection purpose, that is, the first and second electromagnetic deflecting means 18 and 19 are activated, and the dotted lines represent the path of the electron beam when the deflecting system for specimen scanning purpose, that is, the first and second electromagnetic deflecting means 9 and 10 are activated.

When the switches 20 and 15 are changed over to their positions R, a scanned image of the specimen 6 obtained when the electron beam is incident on the specimen 6 at the angle of incidence $+\theta$ is displayed on the cathode-ray tube 17. On the other hand, when the switches 20 and 15 are changed over to their positions L, a scanned image of the specimen 6 obtained when the electron beam is incident on the specimen 6 at the angle of incidence $-\theta$ is displayed on the cathode-ray tube 16. Regardless of whether the angle of incidence of the electron beam on the specimen 6 is $+\theta$ or $-\theta$, the position of incidence of the electron beam on the specimen 6 does not change. Thus, the scanned specimen images displayed on the respective cathode-ray tubes 16 and 17 have the same field of view. Therefore, when the images displayed on the respective cathode-ray tubes 16 and 17 are photographed to obtain two photographs, these photographs provide a stereoscopic photograph pair that can be used for stereoscopic observation of the specimen 6.

The mechanical switches 20 and 15 may be replaced by an electronic switching circuit well known in the art, and the electronic switching circuit may be adapted to make its switching operation in synchronism with the synchronizing signals for the two-dimensional scanning generated from the scanning power supply 11, that is, practically, in synchronism with the X-axis scanning synchronizing signals or the Y-axis scanning synchronizing signals. By the use of such an electronic switching circuit, the scanned specimen images obtained when the angles of incidence of the electron beam on the specimen 6 are $+\theta$ and $-\theta$ respectively can be simultaneously observed on the cathode-ray tubes 16 and 17.

The angle of incidence of the electron beam on the specimen 6 can be changed as desired by adjusting the variable resistors 21R and 21L. This is because, by the adjustment of the variable resistors 21R and 21L, the levels of the d.c signals applied to the first and second electromagnetic deflecting means 18 and 19 respectively can be changed while maintaining constant the ratio between those signals.

A switch 27 disconnectably connects an a.c. power supply 28 to the adder 22. When the switch 27 is turned on, an a.c. signal from the a.c. power supply 28 is added in the adder 22 to the d.c. signal derived from the variable resistor 21R or 21L. Therefore, the sum signals of the d.c. signals and the a.c. signal are applied to the first and second electromagnetic deflecting means 18 and 19 respectively.

When the deflection fulcrum of the electron beam deflected by the deflecting system for optical-axis deflection purpose does not coincide with the position 7, the scanned specimen images displayed on the cathoderay tubes 16 and 17 move on the display screens. On the other hand, when the electron beam deflection fulcrum coincides with the position 7, the movement of the scanned specimen images on the display screens ceases. When the variable resistor 24 is suitably adjusted, the ratio between the sum signals applied to the first and second electromagnetic deflecting means 18 and 19 can be changed as desired. Therefore, the electron-beam deflection fulcrum can be made to coincide with the position 7 by suitably adjusting the variable resistor 24 thereby ceasing the movement of the scanned specimen images displayed on the cathode-ray tubs 16 and 17. Of course, the switch 27 is turned off after such an adjustment step.

In lieu of separately displaying two scanned specimen images on the two cathode-ray tubes 16 and 17 respectively, the display screen of one of the cathoderay tubes may be longitudinally or laterally divided into halves, and the two scanned specimen images may be simultaneously displayed on the divided display screen portions respectively. In another displaying method, the two scanned specimen images may be simultaneously displayed on one of the cathode-ray tubes in different colors and in an overlapping relation.

According to the embodiment of the present invention described above, a parallel electron beam is not incident on the objective lens. Therefore, the aforementioned prior art problems attributable to the use of the parallel electron beam do not arise in the scanning electron microscope of the present invention. Further, in the present invention, the electron beam does not move on the principal plane of the objective lens during scanning a specimen, and the deflecting means for specimen scanning purpose are not disposed inside the objective lens or between the objective lens and the specimen. Therefore, the aforementioned prior art problem attributable to the movement of the electron beam on the principal plane of the objective lens as well a the aforementioned prior art problem attributable to the disposition of the specimen-scanning purpose deflecting means inside the objective lens or between the objective lens and the specimen can be completely solved. That is, by preventing an undesirable increase in the working distance while, at the same time, preventing an undesirable increase in the aperture of the objective lens, high-resolution stereoscopic images of a specimen can be obtained.

Those skilled in the art will readily understand that various changes and modifications may be made in the illustrated embodiment without departing from the subject matter of the present invention, and the present invention is in no way limited to the specific embodiment described by way of example.

I claim:

1. A scanning electron microscope comprising:
   means for emitting an electron beam;
   means for focusing said electron beam on a specimen, said focusing means including an objective lens;
   first deflecting means for deflecting said electron beam so as to scan said specimen, said first deflecting means deflecting said electron beam so that a deflection fulcrum for said electron beam is substantially located on the principal plane of said objective lens;
   second deflecting means for deflecting said electron beam so as to cause said electron beam to be incident on said specimen at a predetermined angle of incidence, said second deflecting means deflecting said electron beam so that the deflection fulcrum for said electron beam coincides substantially with the object point of said objective lens; and
   means for detecting an information signal which is generated from said specimen as a result of scanning said specimen with said electron beam.

2. A scanning electron microscope according to claim 1, wherein said second deflecting means includes means for changing the angle of incidence of said electron beam on said specimen.

3. A scanning electron microscope according to claim 1, further comprising means for adjusting the position of the deflection fulcrum for said electron beam deflected by said second deflecting means.

4. A scanning electron microscope according to claim 1, further comprising means for changing the position of the deflection fulcrum for said electron beam deflected by said second deflecting means, said second deflecting means including means for changing the angle of incidence of said electron beam on said specimen.

5. A scanning electron microscope according to claim 1, wherein said first deflecting means include first and second electromagnetic deflecting means spaced apart from each other in the direction of said electron beam and means for applying a deflection signal to each of said first and second electromagnetic deflecting means, and said second deflecting means included third and fourth electromagnetic deflecting means spaced apart from each other in the direction of said electron beam and means for applying a deflection signal to each of said third and fourth electromagnetic deflecting means.

6. A scanning electron microscope according to claim 5, wherein said second deflecting means includes means for adjusting the deflection signals applied to said third and fourth electromagnetic deflecting means while maintaining constant a ratio of said deflection signals.

7. A scanning electron microscope according to claim 6, wherein said second deflecting means includes means for changing the ratio between the deflection signals applied to said third and fourth electromagnetic deflecting means.

8. A scanning electron microscope according to claim 7, wherein said first electromagnetic deflecting means and said third electromagnetic deflecting means are substantially disposed at a first position between said electron beam emitting means and said objective lens, while said second electromagnetic deflecting means and said fourth electromagnetic deflecting means are substantially disposed at a second position between said electron beam emitting means and said objective lens, and said first and second positions differ from each other in the direction of said electron beam.

9. A scanning electron microscope comprising:
an electron source;
means for energizing said electron source so as to cause emission of an electron beam from said electron source;
means for focusing said electron beam on a specimen, said focusing means including means for forming an image of said electron source at a predetermined position and means for projecting said image formed at the predetermined position onto said specimen;
means for two-dimensionally scanning said specimen by said electron beam thereby causing an information signal characterizing said specimen to be generated from said specimen, said scanning means including specimen scanning deflecting means for two-dimensional deflecting said electron beam so that a deflection fulcrum for said electron beam is substantially located on the principal plane of said objective lens;
means for detecting said information signal; and
angular incidence deflecting means for deflecting said electron beam so that the deflection fulcrum for said electron beam coincides substantially with said predetermined position, thereby causing said electron beam to be incident on said specimen at a predetermined angle of incidence.

10. A planning electron microscope according to claim 9, further comprising means for changing said angle of incidence.

11. A scanning electron microscope according to claim 10, further comprising means for adjusting the deflection fulcrum for said electron beam deflected by said angular incidence deflecting means.

12. A scanning electron microscope according to claim 9, wherein said angular incidence deflecting means includes first and second electromagnetic deflecting means spaced apart from each other in the direction of said electron beam and means for applying a deflection signal to each of said first and second electromagnetic deflecting means.

13. A scanning electron microscope according to claim 12, further comprising means for adjusting the deflection signals applied to said first and second electromagnetic deflecting means while maintaining constant a ratio of said deflection signals, and means for changing said ratio.

14. A scanning electron microscope according to claim 13, wherein said specimen scanning deflecting means includes third and fourth electromagnetic deflecting means spaced apart from each other in the direction of said electron beam, said first electromagnetic deflecting means and said third electromagnetic deflecting means being substantially disposed at a first position between said electron source and said objective lens, said second electromagnetic deflecting means and said fourth electromagnetic deflecting means being substantially disposed at a second position between said electron source and said objective lens, and wherein said first and second positions are spaced apart from each other in the direction of said electron beam.

* * * * *